United States Patent
Diessner

[19]

[11] Patent Number: 6,108,211
[45] Date of Patent: Aug. 22, 2000

[54] ELECTRICAL CONTACT SYSTEM

[76] Inventor: Carmen Diessner, Goldbergstrasse 7, 71065 Sindelfingen, Germany

[21] Appl. No.: 09/305,359

[22] Filed: May 5, 1999

[30] Foreign Application Priority Data

May 7, 1998 [DE] Germany .......................... 198 20 414

[51] Int. Cl.[7] ...................................... H05K 1/00
[52] U.S. Cl. ........................... 361/751; 439/67; 340/365; 200/512
[58] Field of Search .................................... 361/794, 760, 361/763, 764, 751, 757, 627, 643, 647, 781, 828; 174/254; 439/67; 340/365; 345/173; 178/18; 200/5 A, 512

[56] References Cited

U.S. PATENT DOCUMENTS

| | | | |
|---|---|---|---|
| 2,711,983 | 6/1955 | Hoyt | 361/751 |
| 4,413,252 | 11/1983 | Tyler et al. | 340/365 |
| 4,450,324 | 5/1984 | Fukukura et al. | 200/5 A |
| 5,149,918 | 9/1992 | Kozik et al. | 178/18 |
| 5,257,718 | 11/1993 | Chiu | 361/751 |
| 5,461,202 | 10/1995 | Sera et al. | 174/254 |
| 5,708,460 | 1/1998 | Young et al. | 345/173 |

FOREIGN PATENT DOCUMENTS

| | | |
|---|---|---|
| 0388344 | 9/1990 | European Pat. Off. . |
| 4429622 | 2/1996 | Germany . |
| 19607179 | 7/1997 | Germany . |
| 61-279052 | 12/1986 | Japan . |
| 5114392 | 5/1993 | Japan . |
| 613727 | 1/1994 | Japan . |

*Primary Examiner*—Renee Luebke
*Assistant Examiner*—J. F. Duverne
*Attorney, Agent, or Firm*—Browdy and Neimark

[57] ABSTRACT

What is disclosed is an electrical contact system (10) for four pressure sensors (19) to be electrically contacted from different contact sides (13, 14). For this purpose a component side (22) of a flexible circuit board (11) has spaced-apart contact areas (24, 25), which come into contact with opposite contact areas (48, 49) provided on the pressure sensors (19) by folding the circuit board (11) over in a bendable are (52) between two contact areas (24, 25) to provide for a quick and reliable contacting process.

15 Claims, 3 Drawing Sheets

ELECTRICAL CONTACT SYSTEM

BACKGROUND OF THE INVENTION

1. Technical Field of the Invention

The present invention relates to an electrical contact system, as a component of a touch panel, for four pressure sensors that are to be electrically contacted from different contact sides.

2. Prior Art

There are known electrical contact systems, for example for contacting a piezoelectric pressure sensor, wherein the pressure sensor is soldered from one of the contact sides to a contact area on the circuit board, or electrically connected to this contact area by some other known method. In the case of the pressure sensor, it is furthermore necessary to contact same from the contact side opposite the circuit board. This is accomplished with a short conductor, for example gold foil, which is soldered to the pressure sensor on one hand and to a corresponding conductor path on the circuit board on the other hand. To shield the established contacts in the area of the pressure sensor, it may furthermore be necessary to first apply an insulation layer and the electrically conductive shielding on top of this insulation layer.

Producing the electrical connection between the electrical contact system and the pressure sensor is cumbersome, complex and therefore time-consuming and expensive.

OBJECT AND SUMMARY OF THE INVENTION

The present invention therefore has as its aim to create an electrical contact system of the above type, with an improvement which permits a reliable and quick contacting with the pressure sensors.

The pressure sensors can accordingly be contacted via a simple folding of the circuit board in its bendable area, with the result that the contact areas located on both sides of the bendable area come into contact with the corresponding opposite contact surfaces on the pressure sensors to produce an electrical connection. In this manner a contacting of the pressure sensors can be attained quickly and reliably.

In their contacting mode, at least two of the contact areas suitably located opposite one another, spaced apart by a pressure sensor. In this manner the pressure sensor that is provided with contact areas on opposite contact sides is simply and reliably connected to the corresponding contact areas on the circuit board.

The contact areas that correspond to the four pressure sensors are advantageously provided in the area of bendable, loop-like segments of the circuit board, with each bendable area extending along the loop-like segment. Such a loop-like segment has a high flexibility so that the contact area provided at that location can very easily be deflected or folded over towards the respective opposite contact area on the pressure sensors.

In a further advantageous design, signal conductor paths are present, mainly on the circuit board's component side, which are connected at least in part to the contact areas. A circuit board designed in this manner has a simplified structure.

On its reverse, opposite the component side, the circuit board may be provided with a shielding that has electrically conducting areas and covers especially the signal conductor paths present on the component side. In this manner the signal conductor paths are electrically shielded from the reverse of the circuit board. If a segment of the circuit board is now folded over so that it extends essentially parallel to another segment of the circuit board, the signal conductor paths extending in the area of the opposite segments of the circuit board are automatically shielded from both sides since the two segments of the circuit board are facing one another with their component sides and the shielded sections on the reverse of these two segments are facing to the outside. The pressure sensors, which are contacted from opposite contact sides are therefore automatically shielded from the direction of both contact sides when in the contacting mode.

To shield the signal conductor paths from the direction of the component side of the circuit board, it may be covered with a conductive varnish or a conductive frame. In the present case, the conductive frame is a component of a touch panel, with the electrical contact system also representing a component of this unit.

The pressure sensors may be applied to the circuit board in a simple manner by providing adhesive layers for the mechanical connection of the circuit board contact areas to the corresponding opposite contact areas on the pressure sensors. These adhesive layers each are preferably made of a conductive foil, which is provided with conductive adhesive on both sides, and which is located between a contact area and its corresponding opposite contact area when contact is made. This design permits a particularly simple and quick contacting of the pressure sensors.

BRIEF DESCRIPTION OF THE DRAWINGS

An embodiment of the electrical contact system according to the invention is illustrated in detail below, based on the enclosed drawing wherein.

DETAILED DESCRIPTION OF THE PREFERRED EMBODIMENT(S) OF THE INVENTION

Figure 1:
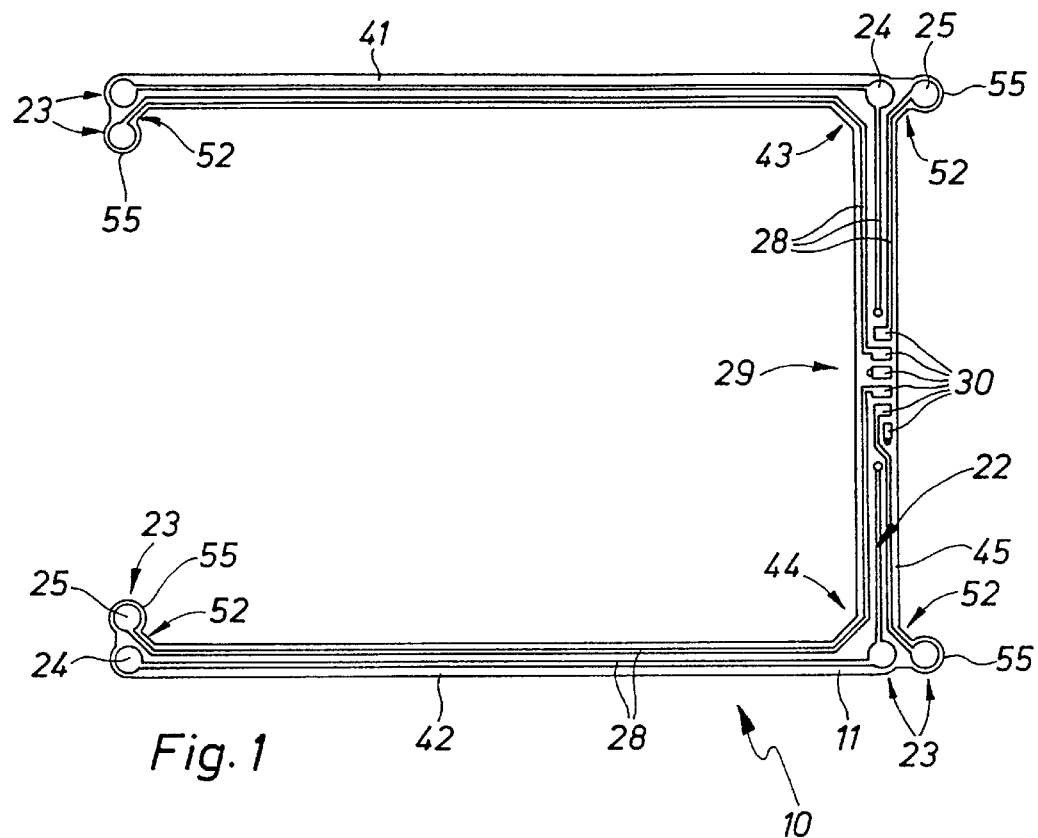
FIG. 1 shows an embodiment of an electrical contact system with a U-shaped circuit board in a top view of the component side of the circuit board, in a non-contacting mode.

FIGS. 1–6 illustrate a first embodiment of the electrical contact system 10 according to the invention comprising a flexible circuit board 11, which may, for example, be U-shaped. The electrical contact system 10 serves to contact at least one electrical component 12, or pressure sensor 19 from different contact sides 13, 14 (see FIG. 4).

Figure 2:
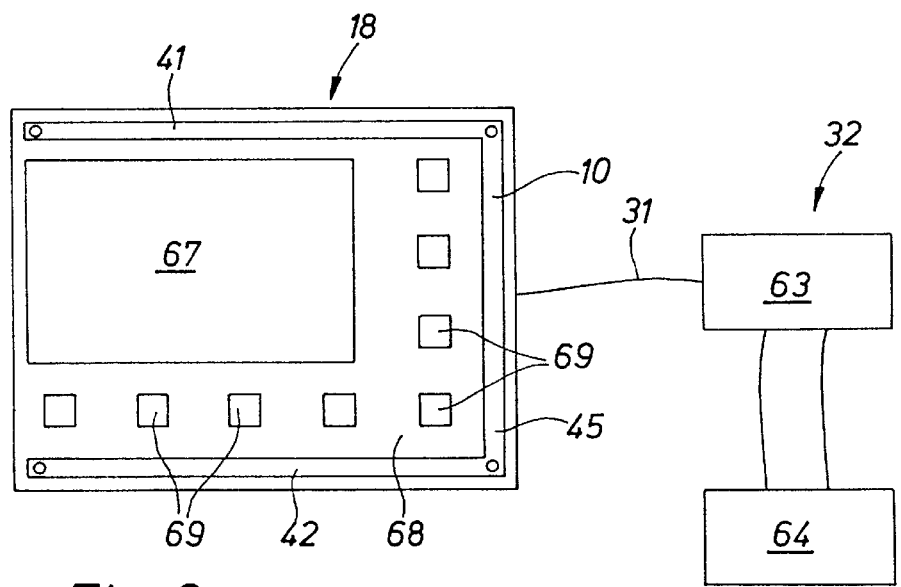
FIG. 2 represents a schematic presentation of the embodiment of the electrical contact system of FIG. 1 in its position of application, as a component of a touch panel.
Figure 3:
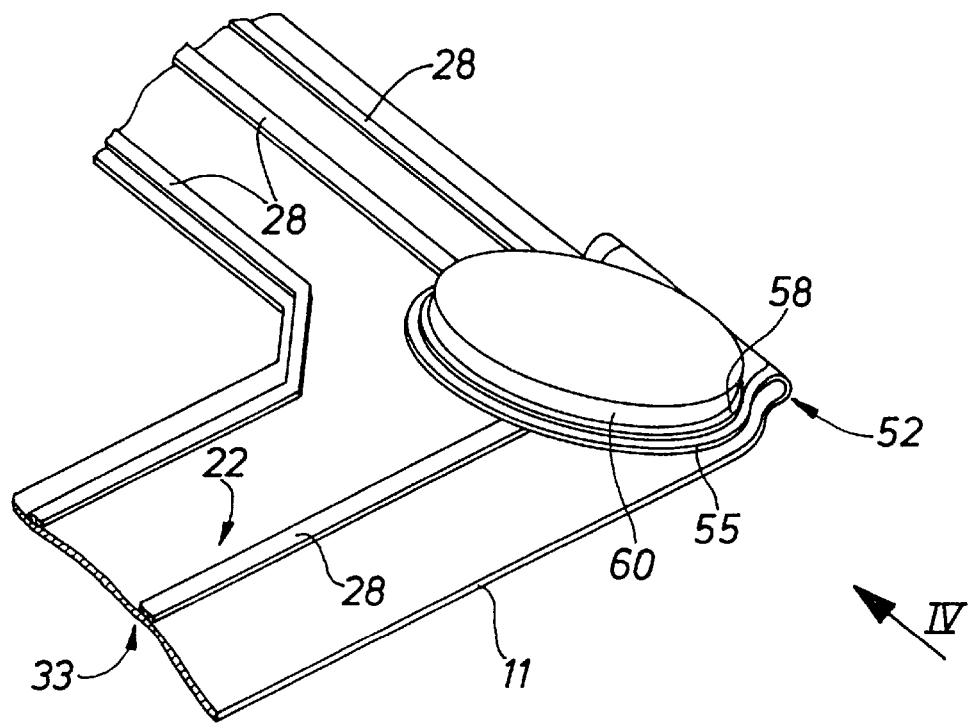
FIG. 3 represents a perspective view of a corner area of the electrical contact system of FIG. 1 in the contacting mode with a pressure sensor not visible in the drawing.
Figure 4:
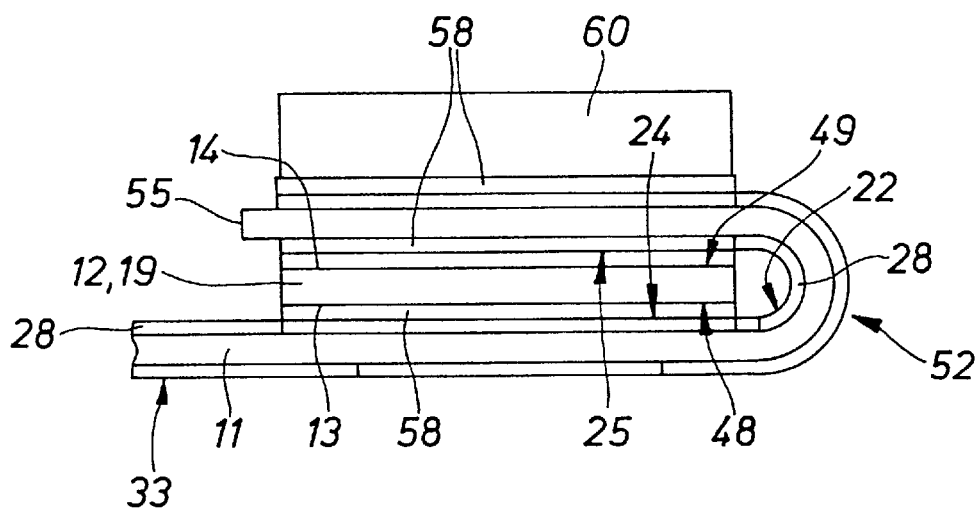
FIG. 4 shows the corner area of the electrical contact system of FIG. 3 in a side view according to the arrow IV in FIG. 3.
Figure 5:
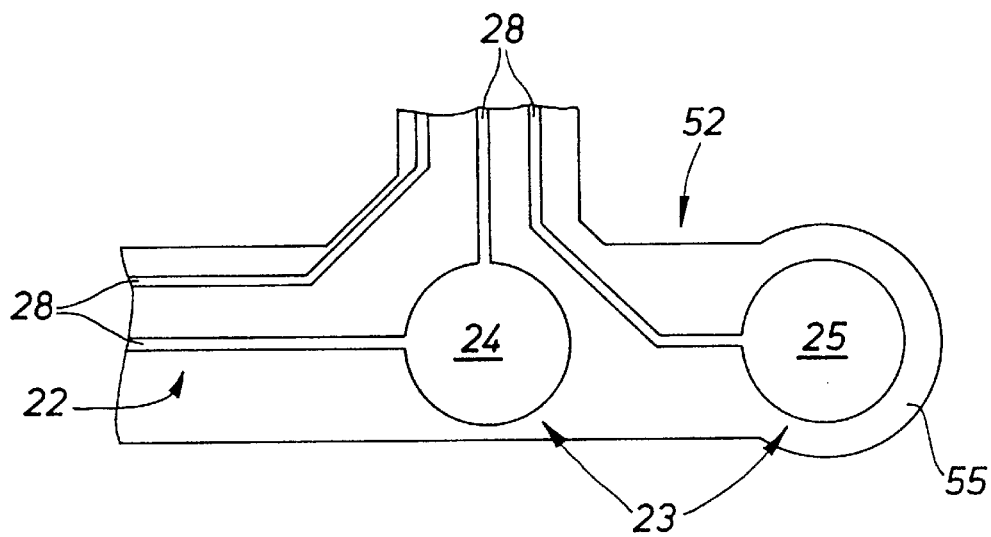
FIG. 5 shows the corner area of the electrical contact system according to FIG. 3 in a non-contacting mode in a top view of the component side of the circuit board.
Figure 6:
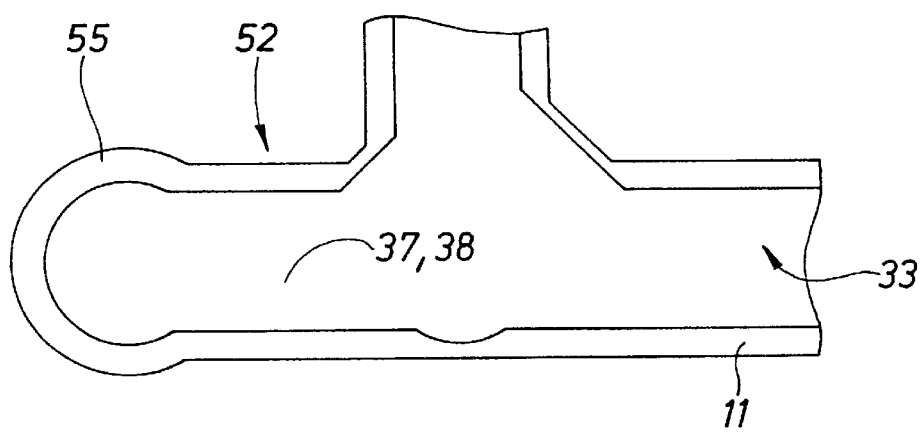
FIG. 6 shows the corner area of the electrical contact system of FIG. 5 in a top view of the reverse side of the circuit board.

In the preferred embodiment, the electrical contact system represents the component of a touch panel 18, as shown schematically in FIG. 2. To this effect, the electrical contact system 10 is designed to contact a plurality of pressure sensors 19 representing the electrical components 12.

The circuit board 11 has a component side 22, on which four groups 23 of two spaced-apart electrically conductive contact area 24, 25 are provided. Each group 23 of contact areas 24, 25 serves to contact one pressure sensor 19. Both the number of provided groups 23, as well as the number of provided contact areas 24, 25 per group may, of course, be varied based on the pressure sensor 19 to be contacted and the intended use of the electrical contact system 10.

A plurality of signal conductor paths 28 extend along the component side 22 of the circuit board 11, which represent the electrical connection of the contact areas 24, 25 to a connection area 29 in which connection areas 30 are provided on the component side 22, which may be used, for example, to connect an electrical conductor assembly 31 or a plug assembly. In this manner the connection areas 24, 25 may be electrically connected to external electrical or electronic components 32, for example to transfer signals.

In this connection area 29, short sections of one or several of the conductor paths 28 may extend along the reverse 33 of the circuit board 11 opposite the component side 22. However, these sections are very short as compared to the conductor path sections on the component side 22. The signal conductor paths 28 are therefore provided mostly on the component side 22 of the circuit board 11.

In contrast to the illustration preferred embodiment of the electrical contact system 10, the possibility exists to additionally provide contacted components or assemblies on the circuit board in the conventional way. These electronic components could, for example, serve for the signal processing of the signals routed on the conductor paths 28.

On the reverse 33 of the circuit board 11, a shielding 37 is provided, which has one or several electrically conducting areas 38, which are connected to ground, particularly in the application position of the electrical contact system 10. In the illustrated embodiment, the shielding 37 is formed by a continuous electrically conductive area 38.

The shielding 37 is arranged in such a way that it covers the signal conductor paths and contact areas 24, 25 present on the component side 22 from the reverse 33 of the circuit board 11. This shielding is provided opposite the signal conductor paths 28 and contact areas 24, 25 on the opposite side 33 of the circuit board 11 and projects at least predominantly in the longitudinal direction of the circuit board 11 beyond the conductor paths 28 and contact areas 24, 25 to be shielded. It is also possible to almost completely cover the reverse side of the circuit board 11 with the shielding 37.

As is apparent from FIG. 1, the circuit board 11 has frame-like design, which is due to its utilization as a component of a touch panel 18, as will be explained in more detail later. It is, however, not completely closed but has a U-shape, which is open on one side. One group 23 on contact areas 24, 25 is arranged on each of the two free ends of the parallel legs 41, 42 of the circuit board 11. The two other contact area groups 23 are each located in a transitional area 43, 44 from a leg 41, 42 to a cross-piece 45 of the circuit board 11 connecting these two legs 41, 42. The cross-piece extends essentially at a right angle to the longitudinal direction of the two legs 41, 42 and connects same in the end area located opposite the unattached ends of the legs 41, 42.

To contact the pressure sensors 19, the corresponding contact areas 24, 25 of a common group 23 are electrically connected to opposite contact ares 48, 49 on the pressure sensor. The opposite contact areas 48, 49 are located on opposite contact sides 13, 14 of the pressure sensor 19. For other electrical components to be contacted, both the number as well as the placement of the opposite contact areas 48, 49 may, of course vary. The arrangement of the contact areas 24, 25 of a common group 23 must, accordingly, be adapted to the requirements. For example, the spacing, the contour, or the size of the contact areas 24, 25 must be changed according to the requirements.

The opposite contact areas 48, 49 on the pressure sensor 19 have a circular shape, which is why a circular shape was also chosen for the contact areas 24, 25 of the electrical contact system 10, whose diameter may be selected larger than the diameter of the corresponding opposite contact areas 48, 49.

A bendable area 52 extends between the pairs of contact areas 24, 25 of a joint group 23, in which the flexible circuit board 11 can be deflected or folded over, so that the contact areas 24, 25 come into electrical contact with the opposite contact areas 48, 49 of the corresponding pressure sensor 19 for the purpose of contacting same. In the present example, the circuit board 11 is folded over in a respective bendable area 52 in the contacting mode in such a way that the contact areas 24, 25 located on both sides of the bendable area 52 are facing one another and are electrically connected to the respective pressure sensor 19 from opposite contact sides 13, 14.

One of the two contact areas 25 belonging to a respective group 23 is arranged on a bendable, loop-like segment 55 of the circuit board 11. The bendable area 52 is also located at the loop-like segment 55 between the two contact areas 24, 25.

To make the electrical contact with the respective pressure sensor 19, the loop-like segment 55 is folded over in such a way that the two contact areas 24, 25 are facing one another, with the pressure sensor sandwiched-in. This folding over of the loop-like segment 55 results in an automatic shielding of the contact area between the pressure sensor 19 and the circuit board 11 from both sides, since the reverse of the circuit board 11 is facing the outside and the shielding 37 provided on the reverse side covers this contact area from both sides.

Adhesive layers are provided for the mechanical and electrical connection of the components 12 formed by the pressure sensors 19 to the circuit board 11. These adhesive layers are, for example, formed by a conductive foil 58, which is coated on both sides with conductive adhesive and is arranged, in the contacting mode, between each contact area 24, 25 and its corresponding opposite contact area 48, 49. This conductive foil 58 may be made, for example, from copper foil. The size and contour of the conductive foil 58 is adapted to the dimensions of the contact area 24, 25 and the respective opposite contact area 48, 49.

Any random other method of connection, such as soldering may, or course, be used as an alternative to the adhesive connection.

In FIG. 2 the electrical contact system is shown, in a schematic illustration, in its application as a component of the touch panel 18. The four pressure sensors connected to the circuit board 11 form a rectangle and are arranged in the corner areas of the touch panel 18. In this design the electrical contact system 10 is covered by a conductive frame of the panel 18 not shown in he drawing, which is arranged opposite the component side 22 of the circuit board 11 and especially also connected to ground. By this means the electrical contact system 10 is completely shielded from the component side 22 even in areas outside the contacting areas that are already shielded by the shielding 37. As an alternative to the conductive frame of the panel 18, the circuit board 11 could first be insulated on its component side 22 and then be coated with a conductive varnish for shielding purposes.

According to the present example, the conductive frame rests on intermediate pieces 60, which are arranged between the frame and the circuit board 11 in the position of application. From FIGS. 3 and 4 it is apparent that each of the pressure sensors 19 provided on the circuit board 11 has a corresponding intermediate piece 60 which, in the contacting mode, sits between the frame of the panel 18 and the respective pressure sensor 19. The intermediate pieces 60 in the illustrated example are electrically conductive and affixed with the aid of a self-adhesive conductive foil 38 onto the section of the shielding 37 provided on the reverse of the loop-like segment 55. In this manner an electrical connection is produced between the shielding 37 and the conductive frame of the panel 18 via the conductive intermediate pieces 60 and the conductive foil 58.

Connected to the conductive frame is a transparent monitor panel not shown in the illustration, through which the operator of the monitor can see and touch to activate certain functions. Depending on where the pressure is exerted on the monitor panel, the pressure sensors 19 receive different amounts of stress, which result in electrical signals of the signal conductor paths 28 in accordance with the force of the pressure. These signals are sent via the electrical conductor assembly 31 to an evaluation unit 32, which may comprise a controller 63 and a connected computer unit 64, especially a PC. The evaluation unit 32 uses the sensor signals to determine the position of the pressure point on the monitor panel and, if appropriate, activates the respective desired function, as is customary with touch panels.

Within the area viewable by the operator through the monitor panel, the touch panel 18 may, for example, have display field 67 to display variable images and information and an activation field 68, which has one or more function keys 69. By exerting pressure, for example with the finger, onto the monitor panel at a location corresponding to function key 69, the operator is able to activate the function assigned to this function key 69. A pressure-sensitive touch panel 18 of this type may be used, for example, to operate automated bank teller machines or the like.

What is claimed is:

1. An electrical contact system, as a component of a touch panel (18), for a plurality of pressure sensors (19), which are to be electrically contacted from different contact sides (13,14) thereof, comprising spaced-apart contact areas (24, 25) on a component side (22) of a flexible circuit board (11), a first of said contact areas (25) being bent around a bendable area (52) on the circuit board (11) over a second of said contact areas (24) to respectively make an electrical contact with opposite electrically conductive contact areas (48, 49) located on contact sides (13, 14) of each of the pressure sensors (19), and wherein the pressure sensors (19) form corners of the circuit board (11) when the pressure sensors (19) are in a contacting mode.

2. An electrical contact system according to claim 1, wherein, in the contacting mode, at least two of the contact areas (24, 25) are located opposite one another, spaced apart by a pressure sensor of said plurality of pressure sensors (19).

3. An electrical contact system according to claim 1, wherein, at least one of the contact areas (24, 25) corresponding to the pressure sensors (19) is provided on a bendable, loop-like segment (55) of the circuit board (11), with the bendable area (52) extending along said loop-like segment (55).

4. An electrical contact system according to claim 1, wherein, signal conductor paths (28) are provided, mainly on the component side (22), which are connected at least in part to the contact areas (24, 25).

5. An electrical contact system according to claim 1, wherein, a shielding (37) having electrically conductive areas (38) is provided on a side (33) opposite of the component side (22) of the circuit board (11), said shielding being under the signal conductor paths (28) and contact areas (24, 25) provided on the component side (22).

6. An electrical contact system according to claim 5, wherein, the component side (22) is covered with a conductive varnish.

7. An electrical contact system according to claim 5, wherein the component side (22) is covered with a conductive frame.

8. An electrical contact system according to claim 1, wherein adhesive layers are provided for electrical and mechanical connection of the contact areas (24, 25) on the circuit board (11) to the corresponding opposite contact areas (48, 49) on the pressure sensors (19).

9. An electrical contact system according to claim 8, wherein, the adhesive layer is formed by a conductive foil (58), which is coated on both sides with a conductive adhesive, with the conductive foil located between each contact area (24, 25) and the corresponding opposite contact area (48, 49) when the contact is made.

10. An electrical contact system according to claim 1, wherein, said circuit board (11) has a frame shape.

11. An electrical contact system according to claim 1, wherein, said circuit board (11) has a U-shape.

12. An electrical contact system according to claim 10, wherein the circuit board (11) includes four pressure sensors (19).

13. An electrical contact system according to claim 11 wherein the circuit board (11) includes four pressure sensors (19).

14. An electrical contact system according to claim 12, wherein the four pressure sensors (19) form the corners of a rectangular circuit board (11) when in a contacting mode.

15. An electrical contact system according to claim 13, wherein the four pressure sensors (19) form the corners of a rectangular circuit board (11) when in a contacting mode.

* * * * *